(12) United States Patent
Maganas

(10) Patent No.: US 8,162,260 B2
(45) Date of Patent: Apr. 24, 2012

(54) MONOMOLECULAR CARBON-BASED FILM FOR FORMING LUBRICIOUS SURFACE ON AIRCRAFT PARTS

(76) Inventor: Thomas C. Maganas, Manhattan Beach, CA (US)

( * ) Notice: Subject to any disclaimer, the term of this patent is extended or adjusted under 35 U.S.C. 154(b) by 329 days.

(21) Appl. No.: 12/396,755

(22) Filed: Mar. 3, 2009

(65) Prior Publication Data

US 2010/0155524 A1    Jun. 24, 2010

Related U.S. Application Data

(63) Continuation-in-part of application No. 12/337,887, filed on Dec. 18, 2008, now Pat. No. 7,959,972.

(51) Int. Cl.
*B64C 1/38* (2006.01)

(52) U.S. Cl. ...... 244/130; 244/200; 244/133; 244/123.1

(58) Field of Classification Search .................. 244/198, 244/200, 130, 133, 171.7, 121, 123.1
See application file for complete search history.

(56) References Cited

U.S. PATENT DOCUMENTS

| | | | |
|---|---|---|---|
| 4,515,847 A | 5/1985 | Taverna et al. | |
| 4,559,973 A | 12/1985 | Hane et al. | |
| 4,866,212 A | 9/1989 | Ingram | |
| 5,143,745 A | 9/1992 | Maganas et al. | |
| 5,413,859 A * | 5/1995 | Black et al. | 428/408 |
| 5,486,096 A * | 1/1996 | Hertel et al. | 416/224 |
| 5,676,070 A | 10/1997 | Maganas et al. | |
| 5,928,618 A | 7/1999 | Maganas et al. | |
| 6,235,247 B1 | 5/2001 | Maganas et al. | |
| 6,264,908 B1 | 7/2001 | Maganas et al. | |
| 6,457,552 B2 | 10/2002 | Maganas et al. | |
| 6,520,287 B2 | 2/2003 | Maganas et al. | |
| 6,683,783 B1 * | 1/2004 | Liu et al. | 361/502 |
| 6,962,681 B2 | 11/2005 | Maganas et al. | |
| 7,220,468 B2 | 5/2007 | Ogawa et al. | |
| 7,220,482 B2 | 5/2007 | Mino et al. | |
| 7,459,635 B2 | 12/2008 | Belli et al. | |
| 7,509,798 B2 | 3/2009 | Maganas | |
| 7,759,579 B2 | 7/2010 | Maganas | |
| 2006/0269740 A1 | 11/2006 | Udy | |
| 2010/0219805 A1 | 9/2010 | Maganas | |

OTHER PUBLICATIONS

Notice of Allowance dated Feb. 5, 2010 cited in U.S. Appl. No. 12/337,862.
Office Action dated Feb. 19, 2010 cited in U.S. Appl. No. 12/396,609.
Notice of Allowance dated Mar. 25, 2010 cited in U.S. Appl. No. 12/396,609.
U.S. Appl. No. 12/337,862, filed Dec. 18, 2008, Maganas.
Search Report dated Aug. 9, 2010 cited in PCT/US2009/068566.
Search Report dated Aug. 3, 2010 cited in PCT/US2009/068574.

* cited by examiner

*Primary Examiner* — Joshua J Michener
(74) *Attorney, Agent, or Firm* — Workman Nydegger

(57) ABSTRACT

A monomolecular carbon-based film can be placed on an aircraft part, such as the leading edge designed to directly impinge against air during flight, ascent or descent, in order to form a smooth surface having increased lubricity and reduced air friction. The aircraft part may be in the form of a helicopter rotor, wing, propeller, fin, aileron, nose cone, and the like. The monomolecular carbon-based film can be deposited on the aircraft part, for example, using a reactor that includes a bed of silica and through which emissions from a diesel engine are passed. The monomolecular carbon-based film decreases air friction and increased lift of a modified aircraft that includes an aircraft part treated with the film. It also provides a structured shock absorber.

18 Claims, 10 Drawing Sheets

MONOMOLECULAR CARBON-BASED FILM FOR FORMING LUBRICIOUS SURFACE ON AIRCRAFT PARTS

CROSS REFERENCE TO RELATED APPLICATION

This application is a continuation-in-part of copending U.S. application Ser. No. 12/337,887, filed Dec. 18, 2008, the disclosure of which is incorporated herein in its entirety.

BACKGROUND OF THE INVENTION

1. The Field of the Invention

The present invention relates to a monomolecular carbon-based film and aircraft parts incorporating such film for forming a more lubricious surface and reduce air friction.

2. The Related Technology

Aircraft typically include wings, propellers, rotors, jet combustion chambers and other parts having leading edges that impinge air at high speed. Such impingement can cause friction, potentially causing heat build-up but more importantly reducing lift.

In view of the foregoing, there is a long-felt but unsatisfied need to provide a more efficient and effective method of creating a lubricious surface on the leading edge or other surfaces of aircraft parts in order to reduce friction and increase lift.

BRIEF SUMMARY

The invention relates to a monomolecular carbon-based film used to form a more lubricious and friction-resistant surface on an aircraft part in order to reduce air friction and/or enhance lift. The monomolecular carbon-based film is comprised of elongated, nano-scale carbon-based molecules aligned on a surface of the aircraft part. The elongated carbon molecules are aligned side-by-side to form the monomolecular film, which has no cracks or other discontinuities and cannot be removed when exposed to pressure and other conditions associated with flight. The result is a film that greatly enhances aircraft flight. In addition, the film is highly chemical resistant, thereby preventing corrosion of the underlying substrate material and the film itself.

The invention also relates to a process for forming the monomolecular carbon-based film on an aircraft part and a process for reducing air friction during flight.

The invention also relates to aircraft, such as helicopters, jet powered aircraft, airplanes, and missiles that include at least one part with a leading edge that has been treated with the monomolecular carbon-based film in order to form a more lubricious and friction-resistant surface, as well as methods for operating such aircraft with reduced air friction.

These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EXEMPLARY EMBODIMENTS

The invention relates to a monomolecular carbon-based film used to form a more lubricious surface on an aircraft part, such as a wing, helicopter rotor, propeller, fin, aileron, or nosecone in order to reduce air friction and/or enhance lift. Air friction is caused by impingement of moving or stationary air against a fast moving aircraft part. Air friction can potentially create heat and/or reduce the ability of a wing to create lift. Air friction is particular acute relative to the leading edge of an aircraft part, which the part that is subjected to the highest degree of air impingement. The monomolecular carbon-based film forms a more lubricious surface that greatly reduces air friction and also protects against corrosion of the film itself and the underlying substrate. The result is more efficient and smoother flight.

As used herein, the term "monomolecular carbon-based film" refers to film that is made by aligning elongated nano-scale, carbon-based molecules that form a film that is a single molecule thick. The film is strong, durable, continuous, indelible, and chemically resistant. The elongated nano-scale carbon-based molecules are aligned shoulder-to-shoulder, are essentially parallel to each other, and extend from the substrate surface. The film when initially formed includes a silicon-based material attached on the outer surface, which can be removed to leave the monomolecular carbon-based film. The film not only provides increased lubricity but also protects against scratching from debris.

As used herein, the term "aircraft part" shall include both aircraft and spacecraft parts that are intended to contact air (such as during takeoff, flight, ascent or descent, liftoff or re-entry).

Figure 3A:
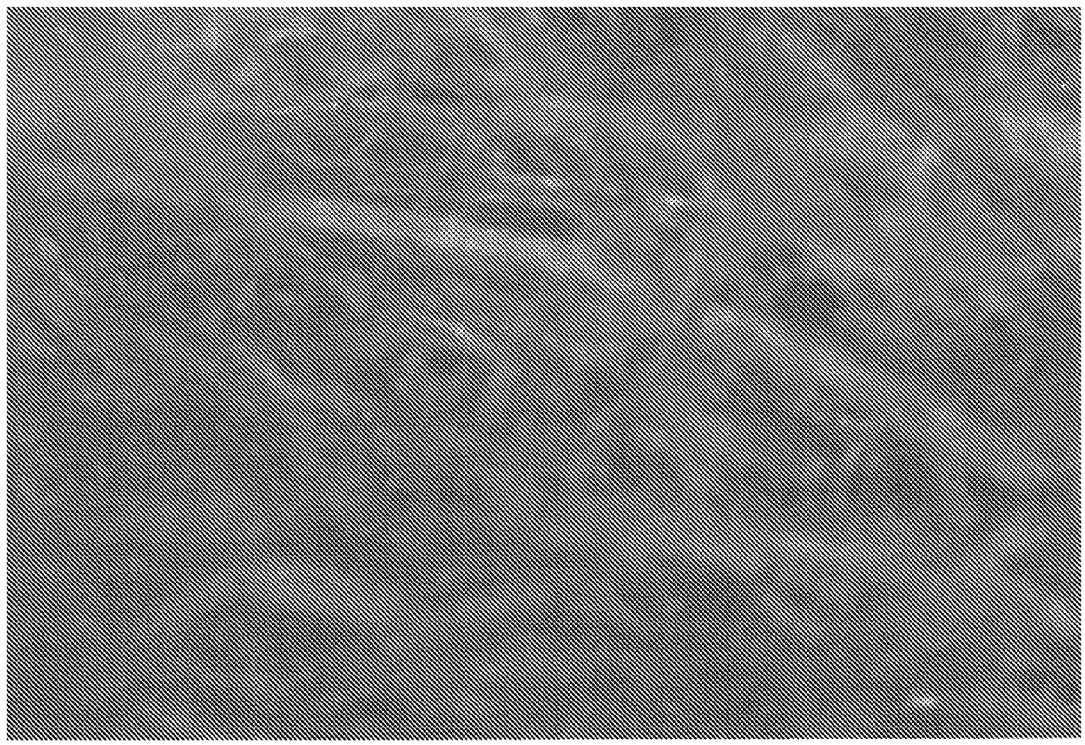
FIG. 3A is a photograph of the material shown in FIG. 2A but magnified 10 times to show that the film is comprised of elongated tubes.
Figure 3B:
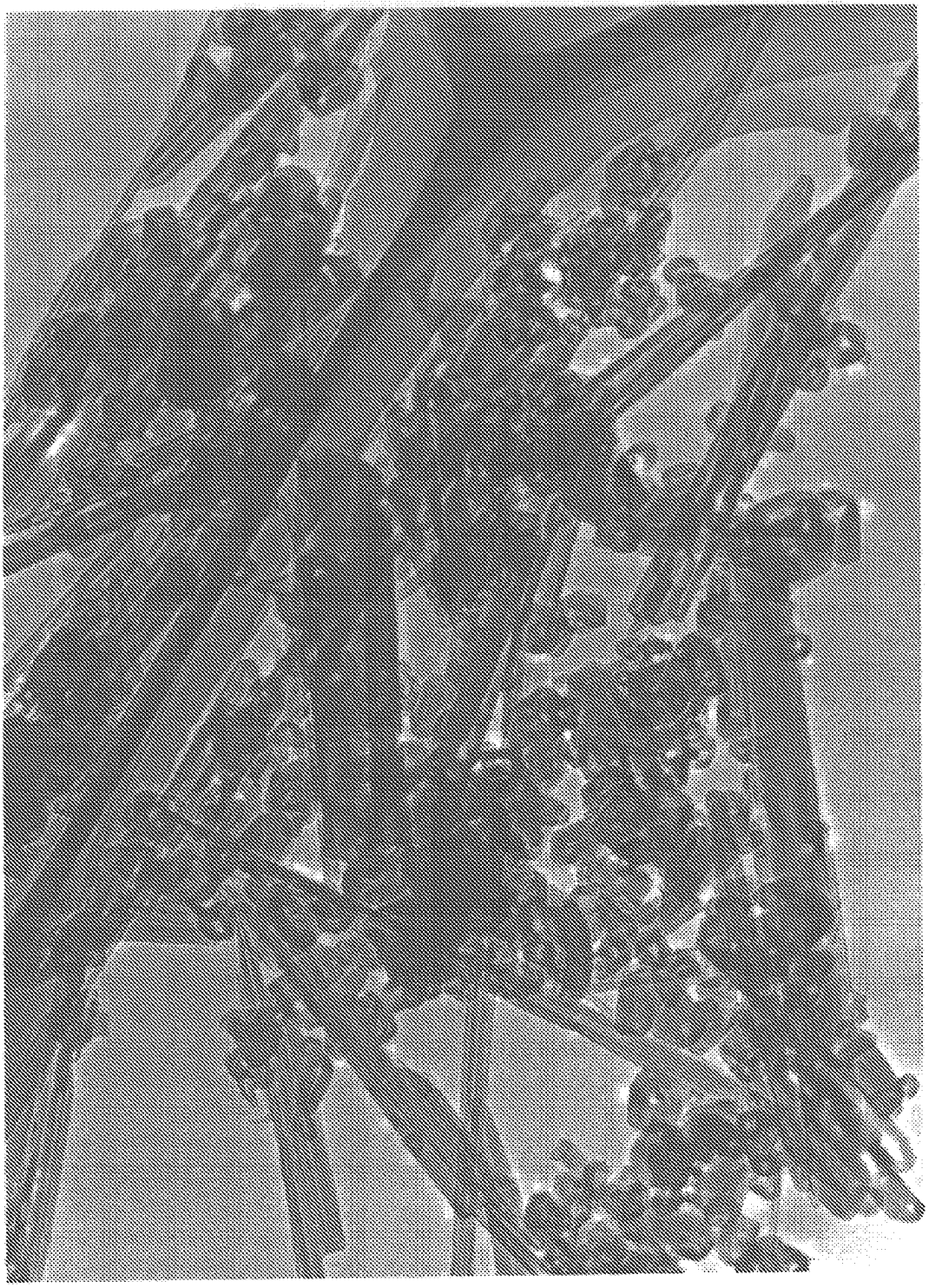
FIG. 3B is a photograph that shows a material similar to and verifies the elongated tubular nature of the material shown in FIG. 3A.
Figure 3C:
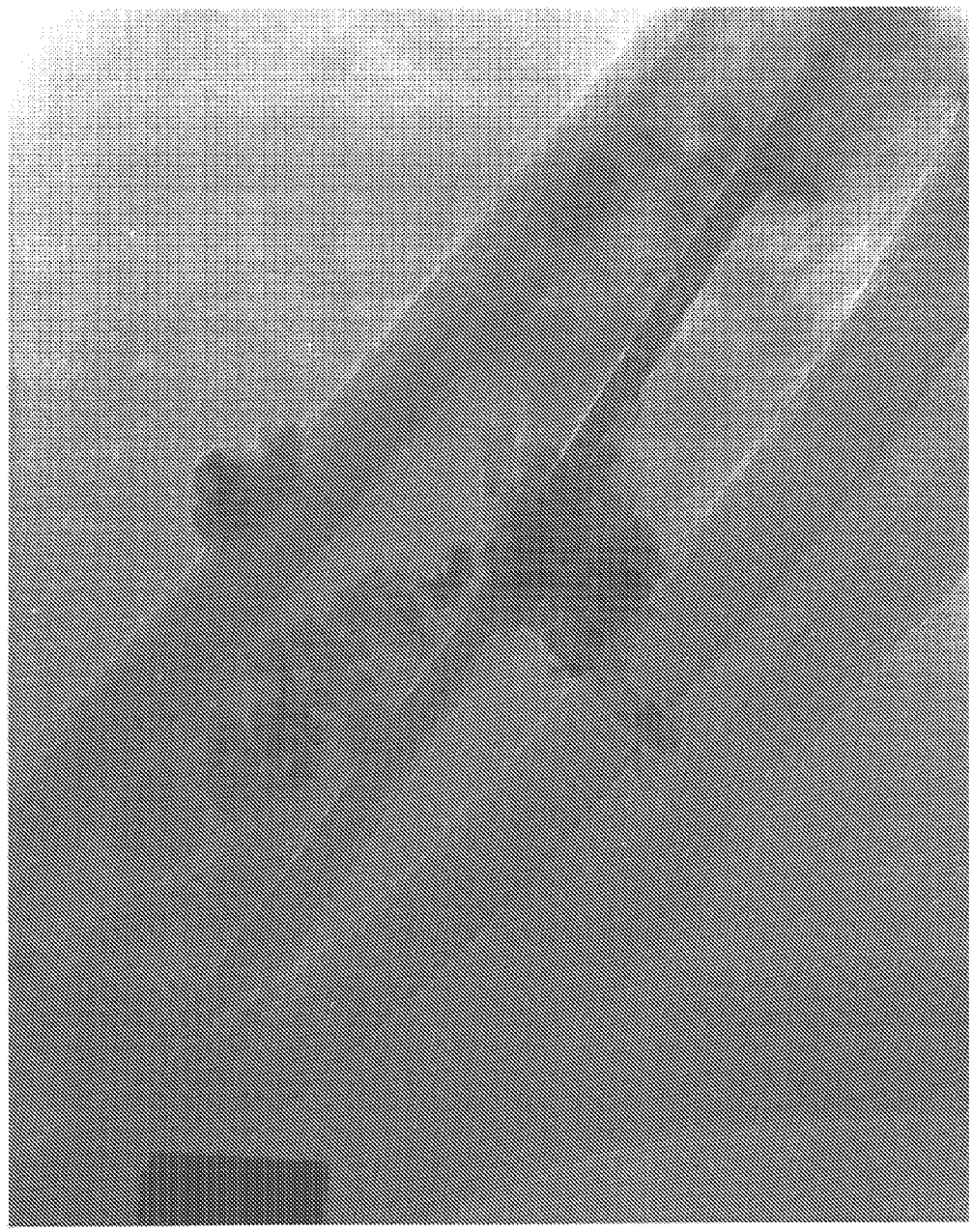
FIG. 3C is a photograph of the tubular material of FIGS. 3A and 3B at higher magnification.
Figure 4:
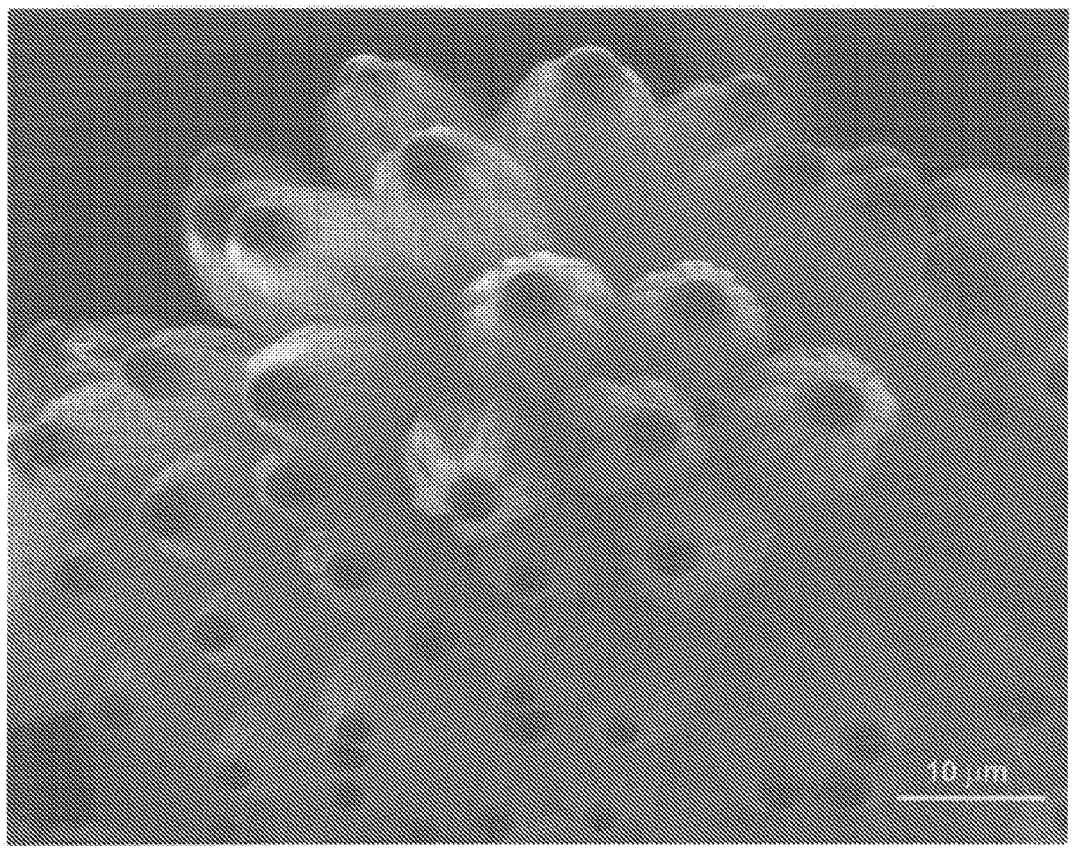
FIG. 4 is a nano-scale photograph that shows a portion of the tubular material shown in FIGS. 3A-3C at higher magnification.
Figure 5:
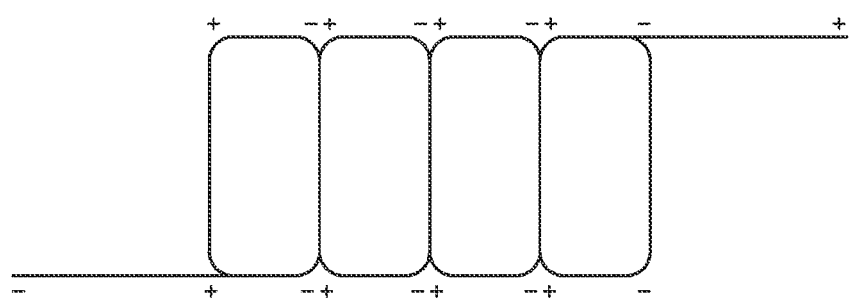
FIG. 5 schematically illustrates a proposed arrangement of carbon molecules in which oppositely charged sides are aligned adjacent to each other.

As shown in FIGS. 1-4, which are a series of photographs at various levels of magnification, elongated carbon-based molecules that make up the monomolecular film are approximately 30 angstroms wide by 50 angstroms long. When compressed, the molecules are elongated to 70 angstroms without cracking the film. When pressure is release, the film returns to 50 angstroms. Individual molecules have a high affinity for each other and are believed to be electromagnetically charged with negative and positive ends aligned or arranged in an orderly fashion to form an unbreakable bond that creates a durable, continuous, indelible, chemically resistant surface deposit or treatment (FIG. 5). The outer or exposed surface of the elongated carbon-based, nano-scale molecules is a product of silicon or silicon nitride particles that form tubes, and which produce or grow the elongated carbon-based nano-scale molecules. This has been verified using a new German electron microscope that produced a photograph released by Johannes Gutenberg University in Mainz Germany (FIG. 4). Excess silicon or silicon nitride can either be ignored or removed through surface treatment (i.e., stripping with hydrofluoric acid with no damage to the carbon-based molecules deposited beneath the silicon, which are microscopically seen generally in the form of pods or fig leaves). The elongated carbon-based, nano-scale molecules are tubular with a dome top. The existence of the monomolecular carbon-based film can be detected a using a volt meter and, in addition and is evidenced by the altered properties of substrates treated therewith (e.g., shielding a power line prevents corona discharge; electrons cannot penetrate the shield, substrate has reduced friction, etc.).

Figure 1:
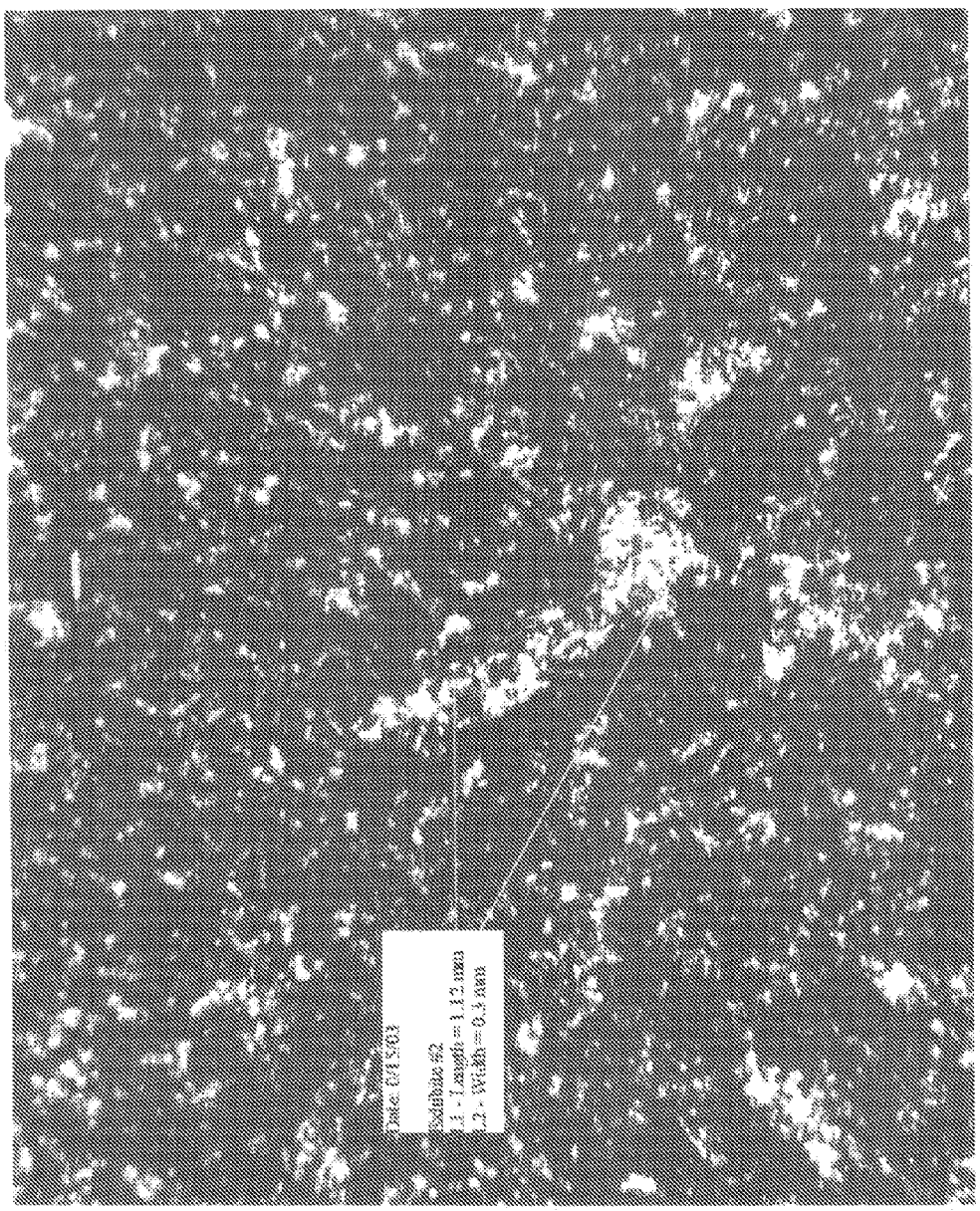
FIG. 1 is a photograph of a monomolecular film magnified 25 times using a 100 mm lens.

FIG. 1 shows a magnified photograph of a monomolecular carbon-based film produced using a diesel engine coupled with a reactor having a bed of silica particles. Methods for manufacturing the film are discussed below in greater detail. The material comprising the film in the photograph of FIG. 1 is shown further magnified in FIG. 2A. FIG. 2B is a magnified photograph of a similar material produced by NEC of Japan (which is a copy of material from Johannes Gutenberg University in Mainz, Germany). The similarities between the materials shown in FIGS. 2A and 2B are readily apparent, particularly when viewing higher resolution originals rather than reproduced copies, with the magnified photograph of FIG. 2B providing independent verification of the existence and nature of the material shown in FIG. 2A.

Figure 2A:
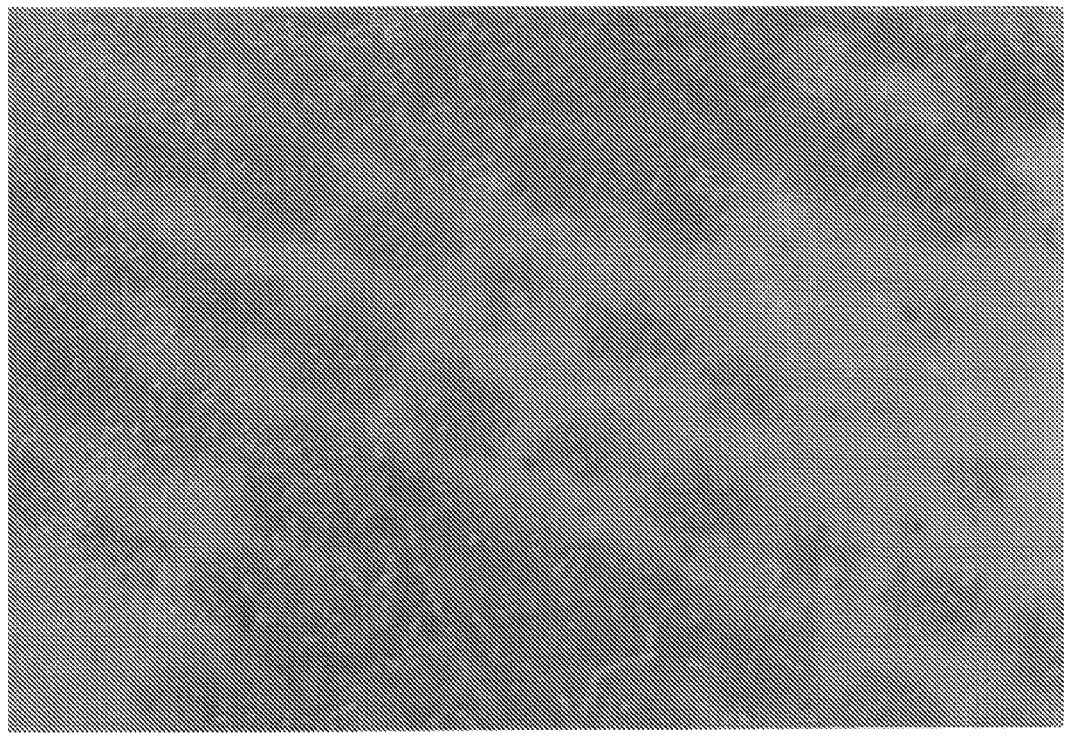
FIG. 2A is a three dimensional photograph of the film shown in FIG. 1 magnified 10 times to show a closer view of the film structure.
Figure 2B:
FIG. 2B is a photograph that shows a material similar to and verifies the structure of the material shown in FIG. 2A.

The material shown in FIG. 2A was further magnified in the photograph shown in FIG. 3A, which better indicates the elongated nature of the carbon-based nano-scale particles within the monomolecular carbon-based film of FIGS. 1 and 2A. FIG. 3B is a magnified photograph of a similar elongated monomolecular material produced by Johannes Gutenberg University in Mainz, Germany. The similarities between the materials shown in FIGS. 3A and 3B are readily apparent, particularly when viewing higher resolution originals rather than reproduced copies, with the magnified photograph of FIG. 3B providing independent verification of the existence and nature of the material shown in FIG. 3A. FIG. 3C is a further magnification of a material similar to those shown in FIGS. 3A and 3B.

FIG. 4 is a nano-scale photograph taken by a new German electron microscope at Johannes Gutenberg University that shows elongated carbon-based nano-scale molecules. The molecules include a dome top that is apparently made of carbon and is also silicon-based extending around the elongated carbon-based, nano-scale molecules.

The elongated carbon-based, nano-scale molecules that make up the monomolecular carbon-based film withstood 40 gigapascals or 400,000 atmospheres of pressure before cracking. Further testing of the dome top molecule showed that its interior withstood 350 gigapascals of electron pressure before cracking. These reports are now recognized by other German universities, as well as the university of Finland and Cornell University in the USA. The monomolecular film also led to other uses, including enhancing power transmission through electrical power lines. The monomolecular film though almost invisible is easily seen with reflection of light, and electron rejection that can be validated with a common volt meter.

The discovery of elongated carbon-based molecules that are aligned to form a monomolecular film was originally discovered and developed in 1987 by Tom Maganas and Al Harrington. Al Harrington identified the elongated molecule, which was measured with an ellipsometer to be 30 angstroms by 50 angstroms. When compressed the molecule increased in height to 70 angstroms without the normal cracking found in other molecules (as now validated by Johannes Gutenberg University and that was described as a hollow tube with a dome top). When pressure was releases the film returned to 50 angstroms. When compressed the elongated molecules did not crack as do all other known materials crack as do soap bubbles under any pressure. This was so reported in U.S. Pat. No. 5,143,745 to Maganas and Harrington. U.S. Pat. No. 6,264,908 to Maganas and Harrington, incorporated by reference, describes a process for forming silicon nitride particles and that was later found to also produce a elongated carbon tube (through chemistry which is not fully understood). The carbon-based elongated molecules separate from the silicon nitrite particles, which produce two separate layers. The top layer is made up as silicon nitride particles that form tubes of various sizes and are seen microscopically as incomplete film, with complete pods that resemble fig leaves, and which is debris of little or no value. Some have mistaken such silicon tubes as carbon based or graphite based. The second layer is made up of elongated carbon-based molecules that, when aligned, form an uncontaminated monomolecular film beneath the microscopically seen silicon nitrite pods (i.e., that appear as fig leaf shaped debris). A similar reaction was discovered in CVD, or Chemical Vapor Deposition, and lead to a second method of production of fullerenes and a third method that produced the same silicon nitrite particles. A fourth method includes arcing carbon to form rods.

The most efficient way to produce the elongated carbon-based, nano-scale molecules that can be aligned to form a monomolecular film uses a reactor that produces hydroxyl radicals that cause reactions in diesel engine compression, that forms supercritical water as a gas that dissolves 18 non organic elements from injected fuel, including sulfur which is dissolved or refined to a trace of sulfate ash, (and a two-thirds reduction of diesel fuel under 80,000 pounds of load) prior to Complete Combustion™. At that point methyl muon radicals are produced as a byproduct of supercritical water at the point of Complete Combustion™ that absorb oxygen and burn unburned elements as fuel. The muon is basically a heavy electron that has an electrical charge identical to that of an electron. Andrei Sakharov and F. C. Frank predicted the phenomenon of muon-catalyzed reactions on theoretical grounds before 1950, and Y. B. Zel'dovitch wrote about the phenomenon of muon-catalyzed reactions in 1954. Each catalyzing muon has a life span of about 2.2 microseconds, as measured in its rest frame, and the entire cycle is dedicated to locating suitable isotopes with which to bind. The muon cycle is the critical step that lowers the normal exhaust average temperature from 707° F. exhaust is reduced to 49° C. output from the Magmas Process. Incomplete combustion, produces conditions described in CFR 40-86.34, also soot, sulfur, and twenty three other methane and non methane hydrocarbon contaminants that are continually dumped into atmosphere. Whereas diesel engines equipped with Maganas catalytic converter producing Complete Combustion emission output at exhaust valve chamber is 99.995% oxygen, nitrogen, and a 80% depleted carbon dioxide, and proven by both 13 and 8 mode EPA mandated tests provided by EPA-DOT certified CFR 40-41 diesel testing. The balance of the 0.005% includes a very small amount of the material that forms the unique elongated molecules.

Recently Johannes Gutenberg University in Mainz, Germany bombarded with electrons the elongated carbon-based molecule which was first discovered, described, and precisely measured that matched size and shape by both Al Harrington and Tom Maganas. The information was published by Rensselaer Polytechnic Institute that verified the existence of the elongated molecule that was collected by the arcing of carbon rods which is a common and expensive method of collecting nano particles, which forms huge amounts of dust and debris and are used in nano composites today. All four methods have a common chemistry (which reaction is not fully understood), is seen with a new more powerful electron microscope that produced a photograph of the elongated molecule and included a scale in nanometers to measure precisely the shape and size of the carbon molecule that confirms Al Harrington, and Maganas 1987 claims. The most important part of the photo confirms that the elongated molecules are a derivative of silicon nitride particles and elongated carbon molecules as a growth of (or a chemical reaction which is not fully understood from) silicon nitrite particles that appear as pods containing silicon tubes gathered as floating grape leaves, and photographically matched all four methods and confirmed all our (Maganas' and Harrington's) previous claims. Rensselaer recently published the electron microscopic photo of the elongated molecules, which were produced by arcing carbon rods. They were aligned with nano wire then bombarded with electrons at a single dwarfed nano carbon molecule that cracked when electron pressures reached 40 gigapascals, or (400,000) atmospheres of pressure. The recent report from Gutenberg University in Mainz, Germany, was reported and certified by Rensselaer Polytechnic Institute, and was recognized by many other German universities, as well as The University of Finland and Cornell University in the USA. An electron microscopic photo was later released by Gutenberg University of our unique elongated molecule fully sized attached to silicon particles, which was described in U.S. Pat. No. 6,264,908 referred to above.

The unique elongated molecules form a lubricious film that is resistant to friction, including air friction caused by impingement of air against an aircraft part, particularly the leading edge. The film greatly increases the ability of an aircraft part, particularly the leading edge, to pass through air with far less friction compared to conventional aircraft parts, including parts coated with ceramic coatings, such as those produced in Italy. The film also forms a corrosion resistant surface, protecting both the substrate and the film itself from the effects of sun, wind, rain, snow and other environmental effects experienced by aircraft.

Figure 6:
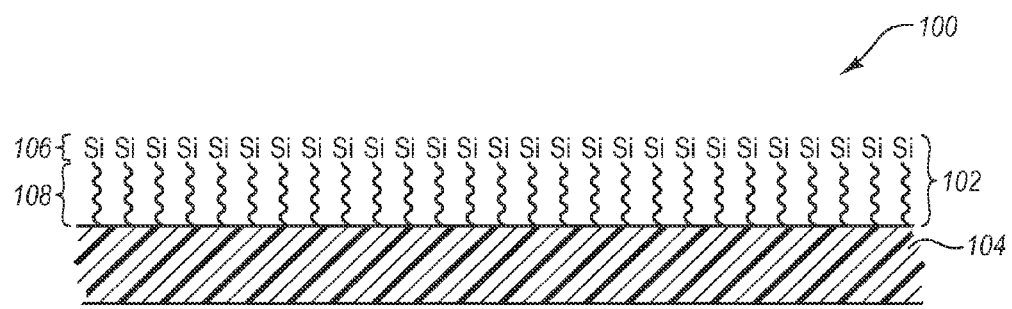
FIG. 6 is a cross-sectional schematic view of a substrate with elongated, nano-scale carbon-based molecules aligned to form a monomolecular carbon-based film on a surface thereof.

FIG. 6 schematically illustrates a treated metal article 100 that includes a monomolecular carbon-based film 102 deposited on a surface of a metal substrate 104. The monomolecular carbon-based film 102 is comprised initially of an outer layer 106 of silicon or silicon nitride and an inner layer 108 of a carbonaceous (e.g., graphitic) strand (e.g., a carbon nanotube or other ordered graphitic carbon material). The inner layer 108 includes individual molecules which are arranged generally parallel to each other and perpendicular to the surface of the substrate 104. The metal substrate may comprise any desired metal that can be formed into a desired shape of a shield (e.g., iron, steel, copper, aluminum, and the like). The outer layer 106 of silicon or silicon nitride debris can be either be removed or ignored as desired.

The monomolecular carbon-based film 102 is remarkably smooth, resistant to chemical attack, and, in combination with the metal substrate 104, provides an object that is highly lubricious and which reduces air friction caused by impingement of the substrate with air.

Figure 7:
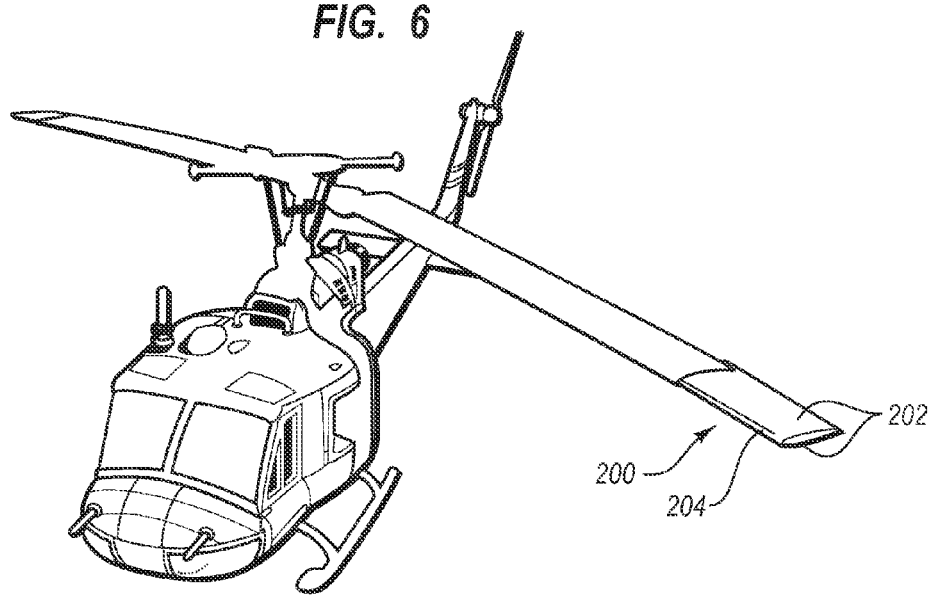
FIG. 7 is a perspective view that illustrates a monomolecular carbon-based film deposited on a surface of a helicopter rotor.

FIG. 7 illustrates helicopter rotor blades 200, each of which includes a main surface 202, a leading edge 204, and a monomolecular carbon-based film on at least a portion of the main surface 202, particularly the leading edge 204, in order to form a lubricious, low friction surface that greatly reduces air friction caused by impingement of the moving rotor blades 200 with moving or stationary air. The monomolecular carbon-based film can also guard against corrosion, scratches to the rotor blades 200 by impinging stirred up ground debris, and provide long-term stability of the rotor blades 200 when exposed to the elements. The film may be deposited in every part of the rotor blades 200.

Figure 8:
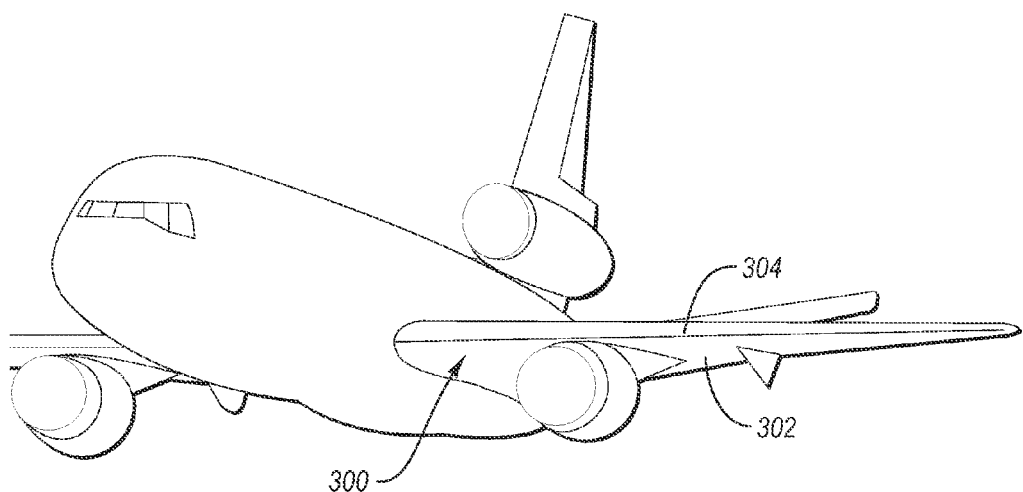
FIG. 8 is a perspective view that illustrates a monomolecular carbon-based film deposited on a surface of an aircraft wing.

FIG. 8 illustrates an aircraft wing 300 that includes a main surface 302, a leading edge 304, and a monomolecular carbon-based film on at least a portion of the main surface 302, particularly the leading edge 304, in order to form a lubricious, low friction surface that greatly reduces air friction caused by impingement of the moving wing 300 with moving or stationary air. The monomolecular carbon-based film can also guard against corrosion, scratches to the wing 300 by impinging stirred up ground debris, and provide long-term stability of the wing 300 when exposed to the elements. The film may be deposited in every part of the rotor 300.

The elongated carbon-based, nano-scale molecules that are aligned to form a monomolecular carbon-based film can be formed on any surface as a byproduct of nano technology that led to a diesel Catalytic Converter™ that produced "Complete Combustion™" and includes a bed of silica and/or alumina particles that interact with the waste exhaust gases for 20 seconds upon ignition to generate highly reactive hydroxyl radicals that are believed to provide several benefits. The 20 second interaction between the bed of silica and/or alumina particles and exhaust gases yields a modified gas stream that consists 99.995% of nitrogen, oxygen, and 80% depleted carbon dioxide, and a small but significant quantity of a byproduct that yields the elongated carbon-based, nano-scale molecules when aligned form a monomolecular carbon-based film, which can be deposited on any type of substrate. If the substrate is an elongate sleeve, depositing the monomolecular carbon-based film on a surface thereof yields an electrical cable shield according to one embodiment of the disclosure.

Figure 9:
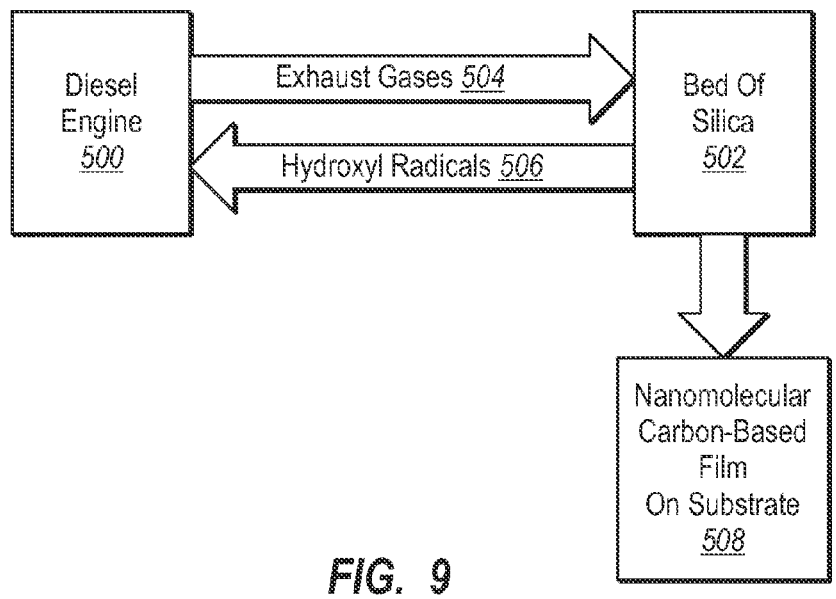
FIG. 9 is a box diagram that schematically illustrates a reaction chamber used in combination with a diesel engine for forming elongated, nano-scale carbon-based molecules that are aligned to form a monomolecular carbon-based film.

FIG. 9 schematically illustrates a system that utilizes a diesel engine in combination with a reactor to form the elongated carbon-based, nano-scale molecules that when aligned forms the monomolecular carbon-based film. FIG. 9 more particularly depicts the movement of exhaust gases and dehydrated hydroxyl radicals between a catalytic converter 502 comprising a bed of catalytically reactive silica particles and a diesel engine, which piston compression temperatures reaching 307° C. This interaction produces billions of dehydrated hydroxyl radicals to form a stream of OH radicals attracted to piston compression to friction temperatures of 307° C., where the OH radicals become hydrated to produce several reactions within milliseconds prior to Complete Combustion™. First, supercritical water is formed as a gas plasma and eliminates 18 known organic elements from injected diesel fuel that includes sulfur and is reduced to a trace element. The second reaction is the muon methyl radical. All reactions occur simultaneously prior to Complete Combustion™. The muon methyl radicals absorb a precise amount of oxygen at each engine mode and is absorbed as fuel to burn unburned organic elements as fuel.

Exhaust gases 504 produced by the diesel engine 500, which were tested and result in 99.995% oxygen, nitrogen and a 80% reduction $CO_2$. Gases tested at the exhaust manifold equaled the same. Hydrated OH radicals are channeled to the bed of silica and, when dehydrated, return to the cylinders (i.e., there is a constant rotation of hydroxyl radicals between the bed of silica and cylinders). There are no further reactions in the bed of silica. The hydroxyl radicals 506 are highly energized and move back toward the diesel engine through the exhaust conduit and manifold, where they enter the cylinders. It is believed that the hydroxyl radicals 506 form supercritical water as a gas plasma within the cylinders (and muon methyl radicals a millisecond prior to combustion), which greatly increases the efficiency of the engine, eliminates soot and fuel blow-by, and reduces the top combustion temperature by 30% or more. The result is single phase emissions and greatly reduced exhaust temperatures compared to conventional diesel engines.

Figure 10:
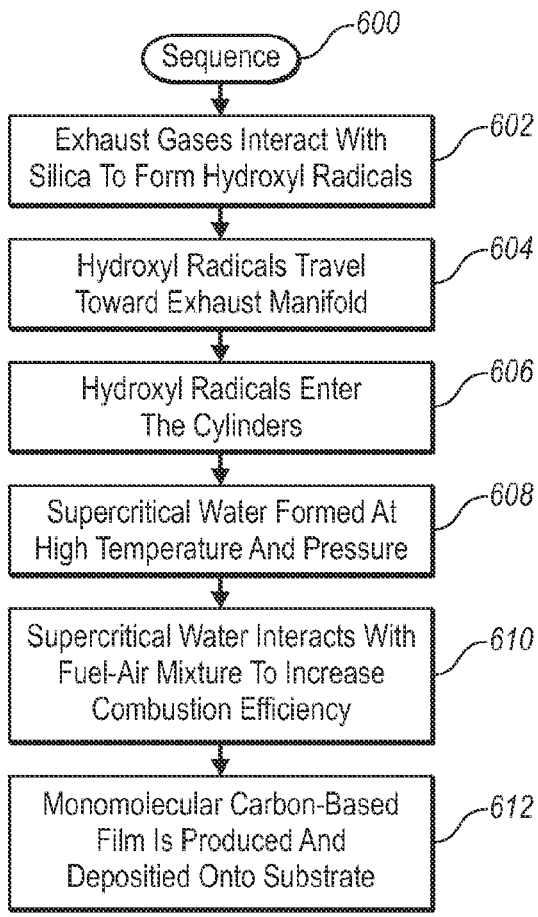
FIG. 10 is a flow chart showing the various steps involved in improving combustion efficiency of a diesel engine and concomitant formation and deposit of elongated, nano-scale carbon-based molecules that are aligned on a substrate to form a monomolecular carbon-based film.

FIG. 10 is a flow diagram showing a sequence 600 including the various steps and reactions involved forming a monomolecular carbon-based film. In a first step 602, exhaust gases interact with silica and/or alumina to form dehydrated hydroxyl radicals. In a second step 604, a portion of the hydroxyl radicals travel to compression friction temperature. In a third step 606, the hydroxyl radicals enter the cylinders. In a fourth step 608, the hydroxyls form supercritical water at high temperature and pressure. In a fifth step 610, the supercritical water interacts with the fuel-air mixture in order to greatly increase combustion efficiency, eliminate soot and fuel blow-by, and reduce combustion temperature. In a sixth step 612, a byproduct in the form of the elongated carbon-based, nano-scale molecules that when aligned forms monomolecular carbon-based film, which can be deposited on virtually any type of substrate, ranging from metallic substrates to a soft drink cup, placed into contact with gases produced by the foregoing sequence.

The reactions of the invention also reduce the temperature of the exhaust. Whereas typical specifications are for temperatures of about 709° F. at the muffler, exhaust temperatures emitted from the catalytic bed of silica were found to be 49° C. (i.e., cool enough that a gas that fees like cool water was detected in a flow meter tube which, when opened, allowed the water-like gas to disappear). In general, the gases exiting the reaction chamber are substantially less than 500° C., typically less than 200° C., often less than 100° C., and sometimes as low as 49° C.

In general, it is currently believed that the "operating temperature" (i.e., the temperature at which the catalytic particles are able to produce a reactive atmosphere of highly reactive hydroxyl radicals, supercritical water as a gas plasma and/or other reactive species (e.g., muon methyl radicals) and also form the monomolecular carbon-based film) is about 49° C. when the OH radicals are dehydrated and as high as about 307° C. when the OH radicals are hydrated.

Figure 11:
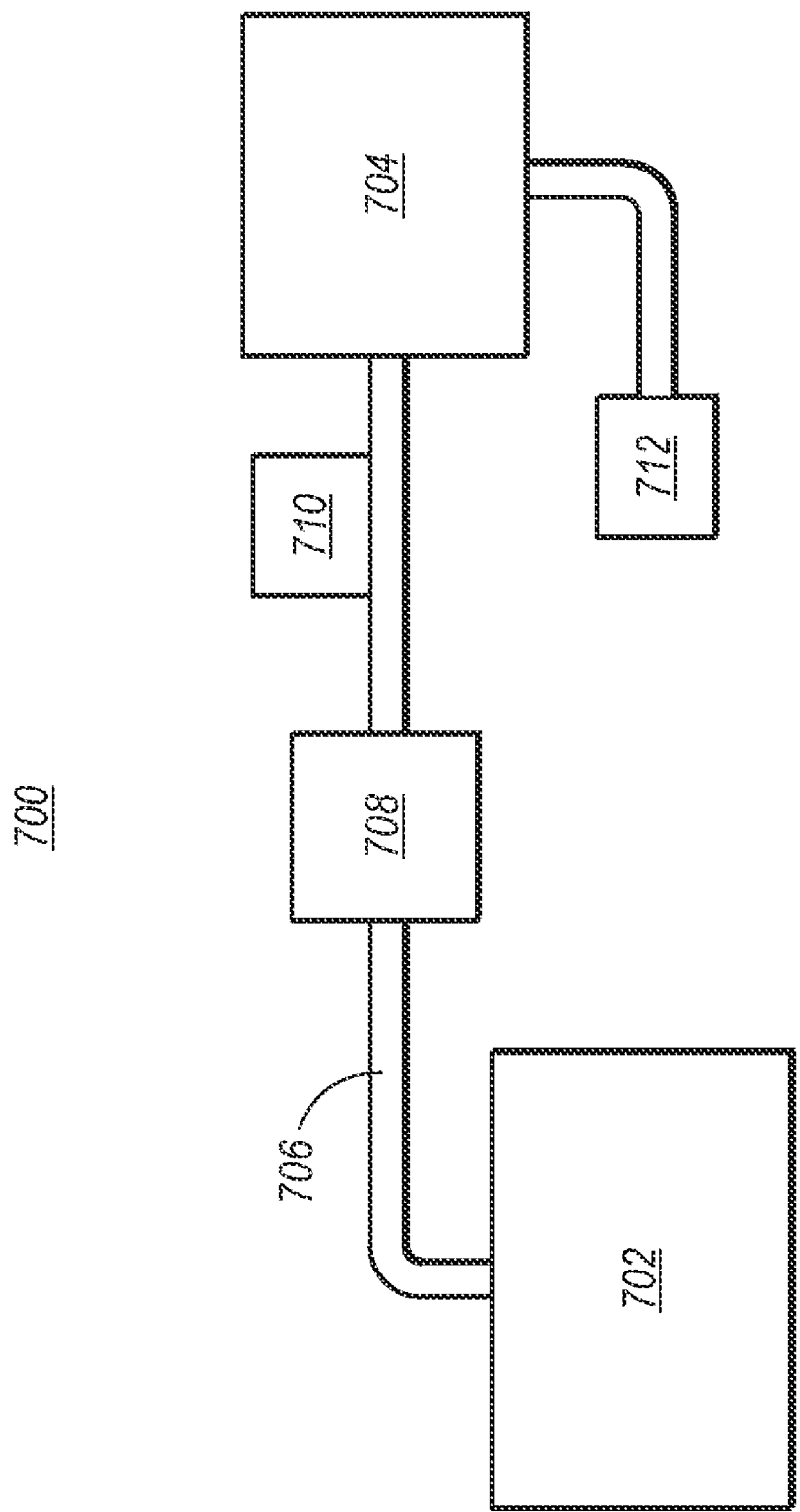
FIG. 11 is a schematic view of a reaction chamber used in combination with an industrial burner for forming elongated, nano-scale carbon-based molecules that are aligned to form a monomolecular carbon-based film.

The catalytic systems used to form the elongated carbon-based, nano-scale molecules, which when aligned form the monomolecular film according to reactions which are not fully understood, can catalytically treat virtually all waste from exhaust streams which includes combustion products of carbon-containing fuels. The wastes are completely consumed other then 80% reduced $CO_2$ due to muon methyl radical oxygen absorption with 20% $CO_2$ output. FIG. 11 is a schematic diagram depicting a catalytic system 700 upsized and configured for use in catalytically enhancing combustion by an industrial burner 702. Industrial burner 702 commonly burns coal, coke, fuel oil, natural gas, or derivatives of coal, petroleum or natural gas, all of which can be liquefied and are capable of generating cheap energy with zero soot, unburnt or partially burnt hydrocarbons, and carbon monoxide. Industrial burner 702 can be utilized in a wide range of industrial operations, such a power generation, metal smelting, manufacturing, and the like.

Waste gases produced by the industrial burner 702 are carried from the burner 702 to the reaction chamber 704 by means of an exhaust conduit or channel 706. A compressor 708 may be used to ensure that the exhaust gases produced by the industrial burner 702 are fed into reaction chamber 704 with adequate pressure. An inline introducer of auxiliary inputs 710 may be used in order to ensure adequate heat and/or moisture content of the exhaust gases before they are introduced into the reaction chamber 704. In addition, or alternatively, beat and/or moisture may be introduced by means of an offline or parallel introducer of auxiliary inputs 712 connected separately to the reaction chamber 704. Introducer 712 may also be used to independently fluidize or at least partially suspend catalytically reactive particles of silica or alumina located within the reaction chamber 704.

In addition to producing clean emissions, the reaction chamber 704 produces an elongated, nanoscale hollow dome-topped carbon-based molecule that when aligned form the carbon-based film on the surface of any type of substrate in contact with a gaseous stream exiting the reaction chamber 704.

According to an alternative embodiment, the elongated carbon-based molecules that when aligned form a monomolecular carbon-based film can be deposited onto a substrate using other methods, including chemical vapor deposition (CVD). Appropriate reagents (i.e., organic molecules, silane, ammonia and a fluorocarbon) are heated to form a plasma, which is then deposited onto a metal substrate to form the monomolecular carbon-based film. However, while CVD forms a useful deposit or film on a metal substrate, it is generally not as readily scalable as the aforementioned method that utilizes diesel exhaust gases from a diesel engine and a reactor comprising a bed of silica and/or alumina particles that produce dehydrated OH radicals.

EXAMPLE 1

Elongated carbon-based, nano-scale molecules that when aligned form a monomolecular carbon-based film were produced by a diesel engine coupled with a reactor containing silica particles (e.g., as in FIG. 9) and deposited onto a 3/16 inch thick steel bar. The formed monomolecular carbon-based film created a smoother surface that was more lubricious to the touch. This deposit could not be scratched off (e.g., with a chisel) or burned. The film sealed the bar and prevented oxidation. In addition, the monomolecular film sealed the rust, which could not be rubbed off. A similarly, coated steel bar was placed into ocean water for 30 days but showed no signs of oxidation, which was surprising since steel is readily oxidized in the presence of salt water.

The steel bar with the monomolecular carbon-based film was tested by passing a current through the interior of the steel bar (i.e., through screws on both ends). A voltage potential of 1.5 volts was applied between the two end screws of the steel bar, which caused a current to pass through the steel bar. The sides of the steel bar that included the monomolecular carbon-based film were found to be electrically insulated and did not permit passage therethrough of any current or electromagnetic radiation. That provided a useful test that shows where the largely invisible film is located when deposited on a metal substrate. The same bar, when manipulated with magnets, increased voltage output to over 4 volts.

The monomolecular film can be applied to the surface of an aircraft part, such as a helicopter rotor, propeller, wing, fin, aileron or nosecone, in order to reduce air friction caused by impingement of air against the surface of the part, particularly the leading edge.

EXAMPLE 2

Elongated carbon-based, nano-scale molecules that when aligned form a monomolecular carbon-based film were deposited onto a rusted ¼ inch thick steel bar that had a coating of rust on the surface. The film was produced using from a diesel engine coupled through the exhaust manifold with a reactor containing silica particles that produced hydrated OH radicals (e.g., as in FIG. 9). The monomolecular carbon-based nanomaterial created a seal that locked oxygen, electrons any other element from penetrating the seal and also locked the rust, with no growth, or change. After five years the film is precisely as when deposited. Later there was the question as to what is holding the film in place as though being fused to the oxide dust.

The metal, after being treated, had a smoother surface that was more lubricious to the touch. The film was tested in a machine thread cutting tool, which surpassed by many times the lubricity of a diamond. There is no lattice between the elongated carbon based molecules and the structure, when compressed grew by at least 20 angstroms as measured by Al Harrington. Each elongated nano-scale molecule is a structured "shock absorber".

The monomolecular film was confirmed and documented in an independent matched test by American Can test laboratory Chicago. Two thread cutting tool bits from the same manufacturer, one with a factory titanium coating, the second deposited with a Maganas monomolecular film, were used to cut threads on a lathe, in an extremely hard to machine material that is subject to enormous friction. The tool bit with the titanium coating was destroyed after 13 cuts where as the second tool bit with the inventive monomolecular film produced 135 cuts. The film was still intact with no sign of wear or friction marks. This was proven with microscopic photos and written documentation. The Maganas monomolecular film can easily be deposited onto any substrate surface and since it is a monomolecular film, it is a single layer of molecules. It has resilience to both pressure and friction.

The monomolecular film can be applied to the surface of an aircraft part, such as a helicopter rotor, propeller, wing, fin, aileron, jet combustion, or nosecone, in order to reduce air friction caused by impingement of air against the surface of the part, particularly the leading edge.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A treated aircraft or spacecraft part having increased lubricity and resistance to air lift friction and scratch damage, comprising:
    a body, main surface, and leading edge designed to directly impinge against air and penetrate the atmosphere during flight, ascent or descent; and
    a continuous, single molecule thick monomolecular carbon-based film having aligned elongated carbon-based molecules deposited on at least the leading edge and optionally at least a portion of the main surface of the aircraft or spacecraft part, the monomolecular carbon-based film providing a smooth surface with increased lubricity and resistance to air friction when the leading edge or main surface of the aircraft or spacecraft part directly impinges air during flight, ascent or descent.

2. A treated aircraft or spacecraft part as in claim 1, wherein the aircraft part is a helicopter rotor blade.

3. A treated aircraft or spacecraft part as in claim 1, wherein the aircraft part is a wing.

4. A treated aircraft or spacecraft part as in claim 1, wherein the aircraft part is a propeller.

5. A treated aircraft or spacecraft part as in claim 1, wherein the aircraft part is a jet compression rotor designed to be subjected to compression during use.

6. A treated aircraft or spacecraft part as in claim 1, wherein the aircraft part is an aileron.

7. A treated aircraft or spacecraft part as in claim 1, wherein the aircraft part is a fin.

8. A treated aircraft or spacecraft part as in claim 1, wherein the aircraft or spacecraft part is a nose cone.

9. A treated aircraft or spacecraft part as in claim 1, wherein the aircraft or spacecraft part comprises at least one metal selected from the group consisting of iron, steel, aluminum, copper, and other dense materials.

10. A treated aircraft or spacecraft part as in claim 8, the monomolecular carbon-based film providing friction, scratch and corrosion resistance to the at least one metal.

11. A modified aircraft or spacecraft having reduced air friction and increased lift during flight, descent or ascent, comprising:
    at least one aircraft or spacecraft part with a leading edge designed to directly impinge against moving or stationary air during flight, descent or ascent; and
    a continuous, single molecule thick monomolecular carbon-based film having aligned elongated carbon-based molecules deposited on at least the leading edge of the aircraft or spacecraft part, the monomolecular carbon-based film providing a smooth surface with increased lubricity and resistance to air friction due to each elongated carbon-based molecule being a naturally structured shock absorber when the leading edge of the aircraft or spacecraft part directly impinges air during flight and ascent or descent of the aircraft or spacecraft.

12. A modified aircraft or spacecraft as in claim 11, the aircraft comprising a helicopter.

13. A modified aircraft or spacecraft as in claim 11, the aircraft comprising a jet powered aircraft engine, wherein the film reduces fuel consumption.

14. A modified aircraft or spacecraft as in claim 11, the aircraft comprising an airplane.

15. A modified aircraft or spacecraft as in claim 11, the aircraft comprising a missile.

16. A method of flying an aircraft with reduced air friction, wing icing, and metal wetting, comprising:
   providing a modified aircraft comprised of:
      at least one aircraft part with a leading edge designed to directly impinge against moving or stationary air during flight, descent or ascent an air; and
      a continuous, single molecule thick monomolecular carbon-based film having aligned elongated carbon-based molecules deposited on at least the leading edge of the aircraft part, the monomolecular carbon-based film providing a smooth surface with increased lubricity and resistance to air friction when the leading edge of the aircraft part directly impinges air during flight, ascent or descent of the aircraft; and
   causing or allowing the modified aircraft to fly, ascend or descend through air.

17. A method of manufacturing a treated aircraft or spacecraft part as in claim 1, comprising:
   operating a reactor containing a bed of particles comprised of at least one of silica or alumina particles coupled to a diesel engine to produce the elongated carbon-based molecules as a byproduct; and
   causing or allowing the elongated carbon-based molecules to form on at least the leading edge of the aircraft or spacecraft part and optionally on at least a portion of the main surface and align so as to form the continuous, single molecule thick monomolecular carbon-based film comprising aligned elongated carbon-based molecules, the monomolecular carbon-based film providing a lubricious surface that inhibits air friction, corrosion and surface scratches.

18. A method as in claim 17, wherein the exhaust stream is produced by a diesel engine, the reactor producing hydroxyl radicals within 30 seconds of diesel ignition, and thereafter the diesel engine having essentially complete combustion in which is 99.995% of the exhaust gases produced thereby include oxygen, nitrogen and 80% depleted $CO_2$, with a substantial drop in exhaust temperature.

* * * * *

UNITED STATES PATENT AND TRADEMARK OFFICE
CERTIFICATE OF CORRECTION

PATENT NO. : 8,162,260 B2
APPLICATION NO. : 12/396755
DATED : April 24, 2012
INVENTOR(S) : Maganas It is certified that error appears in the above-identified patent and that said Letters Patent is hereby corrected as shown below:

<u>Title Page, right-hand column</u>
Third reference, change "Lieu et al." to --Smalley et al.--

In the Specifications:

<u>Column 1</u>
Line 22, change "build-up" to --build-up,--

<u>Column 2</u>
Line 58, change "particular" to --particularly--
Line 59, change "which the part that" to --which is the part that--

<u>Column 3</u>
Line 19, change "release" to --released--
Line 39, change "addition" to --addition,--
Line 40, change "and is evidenced" to --is evidenced--

<u>Column 4</u>
Line 17, change "university" to --University--
Line 20, change "film" to --film,--
Line 21, change "invisible" to --invisible,--
Line 21-22, change "and electron rejection that" to --and its electron rejection--
Line 24-25, change "The discovery of elongated carbon-based molecules that are aligned to form a monomolecular film was originally" to --The elongated carbon-based molecules that align to form a monomolecular film were originally--
Line 44, change "made up as silicon" to --made up of silicon--
Line 48, change "carbon based" to --carbon-based--
Line 48, change "graphite based" to --graphite-based--
Line 61-62, change "non organic" to --non-organic--

Signed and Sealed this
Twenty-third Day of April, 2013

Teresa Stanek Rea
*Acting Director of the United States Patent and Trademark Office*

CERTIFICATE OF CORRECTION (continued)
U.S. Pat. No. 8,162,260 B2

Line 63, change "ash," to --ash--

Column 5
Line 9-12, change "The muon cycle is the critical step that lowers the normal exhaust average temperature from 707°F. exhaust is reduced to 49°C. output from the Magmas Process." to --The muon cycle is the critical step of the Magmas Process that lowers the normal exhaust average temperature from 707°F. to 49°C.--
Line 15-21, change "Whereas diesel engines equipped with Maganas catalytic converter producing Complete Combustion emission output at exhaust valve chamber is 99.995% oxygen, nitrogen, and a 80% depleted carbon dioxide, and proven by both 13 and 8 mode EPA mandated tests provided by EPA-DOT certified CFR 40-41 diesel testing." to --Diesel engines equipped with a Maganas catalytic converter produce exhaust that is 99:995% oxygen and nitrogen, and 80% depleted carbon dioxide, which is proven by both 13 and 8 mode EPA-mandated tests, provided by EPA-DOT certified CFR 40-41 diesel testing.--
Line 24, change "Recently" to --Recently,--
Line 25-28, change "bombarded with electrons the elongated carbon-based molecule which was first discovered, described, and precisely measured that matched size and shape by both Al Harrington and Tom Maganas." to --bombarded an elongated carbon-based molecule (which matched in both size and shape the molecule first discovered, described, and precisely measured by Al Harrington and Tom Maganas) with electrons--
Line 42-43, change "(or a chemical reaction which is not fully understood from)" to --(or a product of a chemical reaction which is not fully understood)--
Line 52, change "(400,000)" to --400,000--
Line 53, change "Germany," to --Germany--
Line 55, change "The" to --the--

Column 6
Line 46, change "rotor 300" to --wing 300--
Line 57, change "consists 99.995% of nitrogen, oxygen," to --consists of 99.995% nitrogen and oxygen,--
Line 60, change "molecules when aligned" to --molecules that, when aligned,--

Column 7
Line 1-2, change "that when aligned forms" to --that, when aligned, form--
Line 6-7, change "which piston compression temperatures reaching 307°C." to --where piston compression temperatures reach 307°C.--
Line 9, change "piston compression to friction temperatures" to --piston compression friction temperatures--
Line 18-19, change "is absorbed as fuel to burn unburned organic elements as fuel." to --are absorbed as fuel to burn unburned organic elements.--
Line 22, change "reduction $CO_2$" to --reduction of $CO_2$--

CERTIFICATE OF CORRECTION (continued)
U.S. Pat. No. 8,162,260 B2

Line 51-54, change "that when aligned forms monomolecular carbon-based film, which can be deposited on virtually any type of substrate, ranging from metallic substrates to a soft drink cup, placed" to --that, when aligned, forms a monomolecular carbon-based film that can be deposited on virtually any type of substrate, ranging from metallic substrates to a soft drink cup, that is placed--

Column 8
Line 11, change "streams which includes" to --streams, including--
Line 13, change "then" to --than--
Line 34, change "beat" to --heat--
Line 42, change "that when aligned" to --that, when aligned,--
Line 47, change "that when aligned" to --that, when aligned,--

Column 9
Line 4, change "similarly," to --similarly--
Line 37, change "electrons any" to --electrons, and any--
Line 46-47, change "when compressed" to --which, when compressed,--
Line 51, change "independent" to --independently--
Line 57, change "where as" to --whereas--
Line 62, change "and" to --and,--

In the Claims:

Column 10
Line 64-65, change "flight and ascent or descent" to --flight, ascent, and/or descent--

Column 12
Line 20, change "is 99.995%" to --99.995%--